United States Patent
Kitahara et al.

(10) Patent No.: US 6,340,518 B1
(45) Date of Patent: Jan. 22, 2002

(54) FLEXIBLE METAL-CLAD LAMINATES AND PREPARATION OF THE SAME

(75) Inventors: Mikio Kitahara; Minehiro Mori; Naoshi Mineta; Takashi Kayama, all of Kanagawa (JP)

(73) Assignee: Mitsui Chemicals, Inc. (JP)

( * ) Notice: Subject to any disclaimer, the term of this patent is extended or adjusted under 35 U.S.C. 154(b) by 0 days.

(21) Appl. No.: 09/268,684

(22) Filed: Mar. 16, 1999

(51) Int. Cl.$^7$ ............................. B32B 7/02; B32B 15/08
(52) U.S. Cl. ..................... 428/215; 156/153; 156/308.2; 156/309.6; 156/330.9; 428/214; 428/332; 428/337; 428/458; 428/473.5
(58) Field of Search ........................... 156/330.9, 331.5, 156/308.2, 309.6, 153; 428/332, 337, 458, 214, 215, 473.5

(56) References Cited

U.S. PATENT DOCUMENTS 5,262,227 A * 11/1993 Tabayashi et al. .......... 428/215
5,306,741 A * 4/1994 Chen et al. ................. 522/164
6,251,507 B1 * 6/2001 Yamamoto et al. ......... 428/215

* cited by examiner

Primary Examiner—D. S. Nakarani
(74) Attorney, Agent, or Firm—Burns, Doane, Swecker & Mathis, L.L.P.

(57) ABSTRACT

A flexible metal foil laminate sheet wherein a polyimide layer comprises a polyimide laminate having a three-layer structure in which thermoplastic polyimide layers are formed on both the surfaces of a polyimide film; metal foil layers are heated and pressed against both the sides of the polyimide laminate; and the thickness of the thermoplastic polyimide layer is 100% or more of an average roughness at 10 points on the surface of the metal foil which contacts the thermoplastic polyimide layer; and a method for manufacturing the flexible metal foil laminate sheet. According to the present invention, there can be manufactured the flexible metal foil laminate sheet in which a necessary and sufficient adhesive force is present in an interface between a metal foil and an insulating layer and which is excellent in heat resistance, chemical resistance, electrical properties and the like.

30 Claims, No Drawings

FLEXIBLE METAL-CLAD LAMINATES AND PREPARATION OF THE SAME

BACKGROUND OF THE INVENTION

1. Field of the Invention

The present invention relates to a method for manufacturing a flexible metal foil laminate which is used in the field of electronic industries.

2. Description of the Prior Art

Polyimide metal foil laminates are mainly used as base materials for flexible printed-wiring boards having flexibility, and they are also used as thin-film heating elements, electromagnetic wave shielding materials, flat cables, wrapping materials and the like. In recent years, with the miniaturization and the density enhancement of electronic equipment using printed-wiring boards, there has been an increase in the utilization of the polyimide metal foil laminate sheets on which parts and elements can be practically mounted at a high density. However, the conventional flexible metal foil laminates have been manufactured by bonding a polyimide film to a metal foil by the use of an adhesive resin. Therefore, their characteristics such as heat resistance, chemical resistance and electrical properties mainly depend on the properties of the adhesive to be used, so that the several excellent characteristics of a polyimide cannot be sufficiently utilized, and particularly, the heat resistance is not sufficient.

In order to improve these disadvantages of the conventional flexible metal foil laminate having an adhesive layer, it has been attempted that a polyimide or a polyamic acid varnish is directly cast onto a metal foil to obtain the flexible metal foil laminate without any conventional adhesive layer. Moreover, it has also been attempted that an adhesive polyimide is laminated on one surface or both the surfaces of a polyimide film, and then putting on a metal foil, or two metal foils thermally to obtain a similar flexible metal foil laminate having an insulating layer all comprising the polyimide.

However, when each of these methods is used selecting, for example, a copper foil as the metal foil, the adhesive strength between the copper foil having a smooth surface and the polyimide is low, so that any satisfactory product cannot be obtained. In order to overcome this drawback, the surface of the metal foil which contacts the polyimide is previously subjected to a surface treatment for roughing the surface to increase surface area.

However, with regard to the interrelation between the roughness on the treated surface of the metal foil and the thickness of the adhesive layer which comes in contact with this treated surface, sufficient discussion has not been made. That is to say, according to our investigation, it has been found that when the thickness of the adhesive layer is small considering the roughness on the treated surface, the recesses on the surface are not completely filled with the adhesive, which causes an adhesive failure. On the other hand, also when the thickness of the adhesive layer is very large considering the roughness on the treated surface, an adhesion cannot exceed a certain value, and the formation of the excessively thick adhesive layer causes the increase of the amount of the adhesive to be used and the extension of the time of an application step and a drying step, which leads to the increase of a manufacturing cost and requires an excessive thickness of the insulating layer.

The present invention intends to provide a method for manufacturing a flexible metal foil laminate in which a polyimide having excellent heat resistance, chemical resistance, electrical properties and the like is used as an insulator and a sufficient adhesion can be obtained between a metal foil and the polyimide.

SUMMARY OF THE INVENTION

The present inventors have intensively investigated, and as a result, it has been found that the thickness of an adhesive layer necessary to obtain a sufficient adhesion at a metal/insulator interface of a flexible metal foil laminate sheet is interrelated with the degree of the roughness on the surface of the metal foil which contacts the adhesive layer, and in consequence, the present invention has been completed.

That is to say, an object of the present invention is to provide a flexible metal foil laminate wherein a polyimide layer comprises a polyimide laminate having a three-layer structure in which thermoplastic polyimide layers are formed on both the surfaces of a polyimide film; metal foil layers are heated and pressed against both the sides of the polyimide laminate; and the thickness of the thermoplastic polyimide layer is 100% or more of an average roughness at 10 points on the surface of the metal foil which contacts the thermoplastic polyimide layer.

Another, object of the present invention is to provide a method for manufacturing a flexible metal foil laminate having a polyimide layer between two metal foil layers, wherein the polyimide layer comprises a polyimide laminate having a three-layer structure in which thermoplastic polyimide layers are formed on both the surfaces of a polyimide film; said method comprising the steps of putting the metal foil layers on both the sides of the polyimide laminate, respectively, and then heating and pressing them, the thickness of the thermoplastic polyimide layer being 100% or more of an average roughness at 10 points on the surface of the metal foil which contacts the thermoplastic polyimide layer.

Still another object of the present invention is to provide a method for manufacturing a flexible metal foil laminate having a polyimide layer between two metal foil layers; said method comprising the step of heating and pressing one metal foil and a polyimide/metal foil laminate including the other metal foil and a polyimide layer comprising a thermoplastic polyimide layer outermost to the other metal foil so that the thermoplastic polyimide layer is placed on the former metal foil, the thickness of the thermoplastic polyimide layer being 100% or more of an average roughness at 10 points on the surface of the metal foil which contacts the thermoplastic polyimide layer.

The present invention just described is characterized in that the metal foil is selected from metal foils comprising copper, iron, nickel, chromium, molybdenum, aluminum, or alloys including these metals.

According to the present invention, there can be manufactured a flexible metal foil laminate in which a necessary and sufficient adhesion is present in an interface between a metal foil and an insulating layer and which is excellent in heat resistance, chemical resistance, electrical properties and the like. In consequence, the thickness of a thermoplastic polyimide layer which is an adhesive layer can be decreased to a necessary and minimum level, which permits the reduction of manufacturing cost. In addition, the flexible metal foil laminate sheet in which the insulating layer is as thin as possible can be manufactured. Next, the present invention will be described in detail.

DETAILED DESCRIPTION OF THE INVENTION

No particular restriction is put on a kind of metal foil which can be used in the present invention, and examples of the usable metal foil include copper, copper alloys, iron, nickel, chromium, molybdenum, aluminum, stainless steels and beryllium-copper alloys. Furthermore, no particular restriction is put on the thickness of the metal foil which can be used in the present invention, but it is usually in the range of 5 to 175 μm, preferably 9 to 105 μm.

On the metal foil which can be used in the present invention, there can be formed an inorganic material such as a single metal or its oxide, or a coupling agent such as aminosilane, epoxysilane or mercaptosilane. On the surface of the metal foil, there can also be carried out a sandblast treatment, a honing treatment, a corona treatment, a plasma treatment or an etching treatment.

A polyimide layer as an insulating layer of the present invention is a polyimide laminate of a three-layer structure which can be formed by laminating a thermoplastic polyimide on both the surfaces of a polyimide film. As the polyimide film which can be used herein, a commercially available polyimide film may be used, or a polyimide film formed by a casting method, an injection method, a stretching method or the like may be used.

The thermoplastic polyimide as an adhesive agent in the present invention is a polymer which has an imide structure in a main chain and in which a glass transition temperature is preferably in the range of 150 to 350° C. and, at a temperature higher than this glass transition temperature range, an elastic coefficient rapidly deteriorates.

Furthermore, the polyimide layer for use in the present invention is also a polyimide and/or a thermoplastic polyimide obtained by laminating a polyimide and/or a thermoplastic polyimide on the metal foil, placing the other metal foil on the laminate, and then heating and pressing them. In this polyimide layer, the outermost layer regarding adhesion to the metal foil layer should be a thermoplastic polyimide, and it may comprises a single polyimide layer or many different polyimide layers. A layer other than the outermost polyimide layer does not always comprise the thermoplastic polyimide. Moreover, so long as the outermost polyimide layer comprises the thermoplastic polyimide, the polyimide layer may be an graded material comprising a plurality of polyimide components.

In the present invention, no particular restriction is put on the thickness of the polyimide layer which is the insulating layer, but it is usually in the range of 5 to 150 μm, preferably 8 to 50 μm.

The surface of the polyimide layer or the polyimide film of the present invention may be subjected to a treatment such as a sandblast treatment, a honing treatment, a corona treatment, a plasma treatment or an etching treatment.

In the present invention, in order to form the polyimide layer, the thermoplastic polyimide is laminated on the polyimide film, or the polyimide and/or the thermoplastic polyimide is laminated on the metal foil. However, with regard to this polyimide and/or the thermoplastic polyimide, it is preferred that the polyimide or a precursor of this polyimide is dissolved in a solvent, and while it is in the dissolving state, it is then coated onto the polyimide film or the metal foil, followed by heating while it is in a tack-free state. No particular restriction is put on an coat technique, and a known coater can be used such as a comma coater, a knife coater, a roll coater, a reverse coater, a die coater, a gravure coater or a wire bar. Furthermore, for a heating technique, a known means such as hot air, hot nitrogen, far infrared rays heater or a electromagnetic heater can be used.

After the desired polyimide layer has been formed on the polyimide film or the metal foil, the volatile components in this layer is sufficiently removed therefrom, and in the case that the precursor of the polyimide is coated, it is necessary to sufficiently heat the layer in order to complete a condensation reaction. As the heating technique in this case, any of the above-mentioned known various means can be used. A heating temperature is preferably a temperature higher than the glass transition temperature of the laminated polyimide. In the case that the polyimide layers are formed on both the surfaces of the polyimide film, it is particularly useful to use an airfloat system in order to prevent the polyimide layer from coming in contact with another substance during the heating. Alternatively, in the case that the polyimide layer is formed on the metal foil, it is useful to heat it in an inert gas in order to avoid the oxidation and deterioration of the metal foil.

A very important requirement in the present invention is that the thickness of the thermoplastic polyimide layer which is an adhesive layer is 100% or more of an average roughness (hereinafter referred to as "Rz") at 10 points on the surface of the metal foil which contacts the thermoplastic polyimide layer. A value of the surface roughness is represented by Rz in accordance with JIS B0601 (Definition and Expression of Surface Roughness).

With regard to the adhesion of the metal/insulating layer interface of the flexible metal foil laminate according to the present invention, if the thickness of the adhesive layer is less than 100% of Rz on the surface of the metal foil which contacts this adhesive layer, the recesses on the surface of the metal foil are not completely filled with the adhesive, which probably causes the formation of fine voids between the metal foil and the adhesive layer. The presence of these voids not only deteriorates the adhesion of the metal/insulating layer interface of the flexible metal foil laminate but also causes blister and peeling in a high-temperature processing step such as a soldering treatment.

On the other hand, if the thickness of the adhesive layer is 100% or more of Rz on the surface of the metal foil which contacts this adhesive layer, such problems do not occur. However, it has also been found that as the thickness of the adhesive layer is increased, the adhesive force also increases, but if this thickness is in excess of 120%, the value of the adhesion reaches substantially equilibrium, and hence, if the thickness is in excess of 150%, the adhesion does not exceed the value at the time of 120%. The meaningless increase of the thickness of the adhesive layer beyond this value causes technical and economical problems such as the extension of a drying time and the difficulty of holding the uniformity of the coated surface in a step of coating the adhesive onto the polyimide film or the metal foil and a step of drying the same. In view of this fact, the upper limit of the thickness of the adhesive layer is less than 300%, preferably less than 200%, more preferably less than 150%, most preferably less than 120% of Rz on the surface of the metal which contacts this adhesive layer. It is self-explanatory that, in the laminate in which the thinner insulating layer is required, the thickness of the adhesive layer constituting a part of the insulating layer should be as thin as possible in a range where physical properties are not impaired, i.e., the above-mentioned range.

As understood from the foregoing, it has been found that the flexible metal foil laminate which has the necessary and sufficient adhesion at the interface between the metal foil and the insulating layer and which can hold down manufacturing cost and in which the thin insulating layer is used can be manufactured by setting the thickness of the adhesive layer to 100% or more of Rz on the surface of the metal which contacts the adhesive layer.

The polyimide laminate or the polyimide/metal foil laminate obtained by the above-mentioned procedure is then put on the metal foil, followed by heating and pressing, to complete the flexible metal foil laminate. This heating and pressing can be accomplished by suitably using a known technique such as a method using hot rolls for hot lamination, or hot pressing. Heating conditions depend on the glass transition temperature of the thermoplastic polyimide to be used, but the heating temperature is preferably the glass transition temperature or more, more preferably 20° C. higher than the glass transition temperature. As pressing conditions, a pressure of 20 to 150 kg/cm² is usually used.

Next, the present invention will be described in more detail in accordance with the following examples.

EXAMPLES 1 AND 2, COMPARATIVE EXAMPLES 1 AND 2

A polyamic acid varnish (trade name PI-A, made by Mitsui Toatsu Chemicals, Inc.) which was a precursor of a thermoplastic polyimide was coated onto both the surfaces of a commercially available polyimide film (trade name Apical AH, made by Kanegafuchi Chemical Industry Co., Ltd., thickness=25 μm) by a coater, followed by drying, to obtain a polyimide laminate. At this time, the thickness of the coated polyamic acid varnish on each surface was 0.3 μm in Comparative Example 1, 1.0 μm in Comparative Example 2, 2.0 μm in Example 1, and 3.0 μm in Example 2 in terms of dry thickness.

Rolled copper foils (trade name BHY-02B-T, made by Japan Energy Co., Ltd., thickness=18 μm, Rz=1.85 μm) were coated on both the surfaces of this polyimide laminate, respectively, and they were then pressed under heating by the use of a hot press. Incidentally, the surface roughness of the copper foils is a value of Rz measured by a surface roughness meter (trade name Surfcoder SE-30D, made by Kosaka Laboratory).

For the thus obtained flexible metal foil laminates the peel strength of each metal foil/polyimide interface was measured. Table 1 shows the results of Examples 1 and 2 as well as Comparative Examples 1 and 2.

TABLE 1

|  | Thickness of PI-A (μm) | Peel Strength (kg/cm) |
|---|---|---|
| Comp. Example 1 | 0.3 | 0.1 |
| Comp. Example 2 | 1.0 | 0.1 |
| Example 1 | 2.0 | 1.4 |
| Example 2 | 3.0 | 1.4 |

EXAMPLES 3 TO 5, COMPARATIVE EXAMPLE 3

A polyamic acid varnish (trade name PI-A, made by Mitsui Toatsu Chemicals, Inc.) which was a precursor of a thermoplastic polyimide was coated onto both the surfaces of a commercially available polyimide film (trade name Apical AH, made by Kanegafuchi Chemical Industry Co., Ltd., thickness=25 μm) by a coater, followed by drying, to obtain a polyimide laminate. At this time, the thickness of the coated polyamic acid varnish on each surface was 0.3 μm in Comparative Example 3, 0.5 μm in Example 3, 1.0 μm in Example 4, and 2.0 μm in Example 5 in terms of dry thickness.

Stainless steel foils (trade name SUS304H-TA, made by Nisshin Steel Co., Ltd., thickness=50 μm, Rz=0.47 μm) were coated on both the surfaces of this polyimide laminate, respectively, and they were then pressed under heating by the use of a hot press. Incidentally, the surface roughness of the stainless steel foils is a value of Rz measured by a surface roughness meter (trade name Surfcoder SE-30D, made by Kosaka Laboratory).

For the thus obtained flexible metal foil laminates the peel strength of each stainless steel foil/polyimide interface was measured. Table 2 shows the results of Examples 3 to 5 as well as Comparative Example 3.

TABLE 2

|  | Thickness of PI-A (μm) | Peel strength (kg/cm) |
|---|---|---|
| Comp. Example 3 | 0.3 | 0.1 |
| Example 3 | 0.5 | 1.1 |
| Example 4 | 1.0 | 1.2 |
| Example 5 | 2.0 | 1.2 |

EXAMPLES 6 AND 7, COMPARATIVE EXAMPLES 4 AND 5

A polyamic acid varnish (trade name PI-KBP2, made by Mitsui Toatsu Chemicals, Inc.) was coated onto the surface of the above-mentioned rolled copper foil by a coater, followed by drying. Furthermore, a polyamic acid varnish (trade name PI-A, made by Mitsui Toatsu Chemicals, Inc.) which was a precursor of a thermoplastic polyimide was coated onto the dried polyamic acid film and then dried to obtain a polyimide/metal foil laminate. At this time, the thickness of the coated polyamic acid varnish PI-KBP2 was 13 μm in all examples in terms of dry thickness, and the thickness of the coated polyamic acid varnish PI-A was 0.3 μm in Comparative Example 4, 1.0 μm in Comparative Example 5, 2.0 μm in Example 6, and 3.0 μm in Example 7 in terms of dry thickness.

The rolled copper foil was put on the polyimide side of this polyimide/metal foil laminate, and they were then pressed under heating by the use of a hot press. For the thus obtained flexible metal foil laminates the peel strength of each rolled copper foil/polyimide interface was measured. Table 3 shows the results of Examples 6 and 7 as well as Comparative Examples 4 and 5.

TABLE 3

|  | Thickness of PI-A (μm) | Peel Strength (kg/cm) |
|---|---|---|
| Comp. Example 4 | 0.3 | 0.1 |
| Comp. Example 5 | 1.0 | 0.1 |
| Example 6 | 2.0 | 1.4 |
| Example 7 | 3.0 | 1.4 |

EXAMPLES 8 to 10, COMPARATIVE EXAMPLE 6

A polyamic acid varnish (trade name PI-KBP2, made by Mitsui Toatsu Chemicals, Inc.) was coated onto the surface of the above-mentioned rolled copper foil by a coater, followed by drying. Furthermore, a polyamic acid varnish (trade name PI-A, made by Mitsui Toatsu Chemicals, Inc.) which was a precursor of a thermoplastic polyimide was coated onto the dried polyamic acid film and then dried to obtain a polyimide/metal foil laminate. At this time, the thickness of the coated polyamic acid varnish PI-KBP2 was 13 μm in all examples in terms of dry thickness, and the thickness of the coated polyamic acid varnish PI-A was 0.3 μm in Comparative Example 6, 1.0 μm in Example 8, 2.0 μm in Example 9, and 3.0 μm in Example 10 in terms of dry thickness.

The above mentioned stainless steel foil was put on the polyimide side of this polyimide/metal foil laminate, and they were then pressed under heating by the use of a hot press. For the thus obtained flexible metal foil laminates the peel strength of each stainless steel foil/polyimide interface was measured. Table 4 shows the results of Examples 8 to 10 as well as Comparative Example 6.

TABLE 4

|  | Thickness of PI-A (μm) | Peel strength (kg/cm) |
|---|---|---|
| Comp. Example 6 | 0.3 | 0.1 |
| Example 8 | 0.5 | 1.1 |
| Example 9 | 2.0 | 1.2 |
| Example 10 | 3.0 | 1.2 |

What is claimed is:

1. A metal foil laminate wherein a polyimide layer (A) comprises a polyimide laminate having a three-layer structure in which thermoplastic polyimide layers are formed on both the surfaces of a polyimide film; metal foil layers are heated and pressed against both the sides of the polyimide laminate; and the thickness of the thermoplastic polyimide layer is 100% or more and less than 300% of an average roughness at 10 points on the surface of the metal foil which contacts the thermoplastic polyimide layer, wherein said average roughness of said metal foil is 0.47 to 1.85 μm.

2. The metal foil laminate according to claim 1 wherein the thickness of the metal foil is in the range of 5 to 175 μm.

3. The metal foil laminate according to claim 1 wherein the glass transition temperature of the thermoplastic polyimide is in the range of 150 to 350° C.

4. The metal foil laminate according to claim 1 wherein the thickness of the polyimide layer (A) is in the range of 5 to 150 μm.

5. The metal foil laminate according to claim 1 wherein heating and pressing conditions are the glass transition temperature or more of the thermoplastic polyimide and in the range of 20 to 150 kg/cm$^2$.

6. The metal foil laminate according to claim 1 wherein the metal foil is selected from copper, iron, nickel, chromium, molybdenum, aluminum, or alloys mainly including these metals.

7. The metal foil laminate according to claim 6 wherein the metal foil is copper.

8. The metal foil laminate according to claim 1 wherein the thickness of the thermoplastic polyimide layer is 100% or more and less than 200% of an average roughness at 10 points on the surface of the metal foil which contacts the thermoplastic polyimide layer.

9. The metal foil laminate according to claim 1 wherein the thickness of the thermoplastic polyimide layer is 100% or more and less than 150% of an average roughness at 10 points on the surface of the metal foil which contacts the thermoplastic polyimide layer.

10. The metal foil laminate according to claim 1 wherein the thickness of the thermoplastic polyimide layer is 100% or more and less than 120% of an average roughness at 10 points on the surface of the metal foil which contacts the thermoplastic polyimide layer.

11. A method for manufacturing a metal foil laminate wherein a polyimide layer (A) comprises a polyimide laminate having a three-layer structure in which thermoplastic polyimide layers are formed on both the surfaces of a polyimide film; said method comprising the steps of placing the metal foil layers on both the sides of the polyimide laminate, respectively, and then by heating and pressing them, the thickness of the thermoplastic polyimide layer being 100% or more and less than 300% of an average roughness at 10 points on the surface of the metal foil which contacts the thermoplastic polyimide layer, wherein said average roughness of said metal foil is 0.47 to 1.85 μm.

12. The method for manufacturing the metal foil laminate according to claim 11 wherein the thickness of the metal foil is in the range of 5 to 175 μm.

13. The method for manufacturing the metal foil laminate according to claim 11 wherein the glass transition temperature of the thermoplastic polyimide is in the range of 150 to 350° C.

14. The method for manufacturing the metal foil laminate according to claim 11 wherein the thickness of the polyimide layer (A) is in the range of 5 to 150 μm.

15. The method for manufacturing the metal foil laminate according to claim 11 wherein heating and pressing conditions are the glass transition temperature or more of the thermoplastic polyimide and in the range of 20 to 150 kg/cm$^2$.

16. The method for manufacturing the metal foil laminate according to claim 11 wherein the metal foil is selected from copper, iron, nickel, chromium, molybdenum, aluminum, or alloys mainly including these metals.

17. The method for manufacturing the metal foil laminate according to claim 16 wherein the metal foil is copper.

18. The method for manufacturing the metal foil laminate according to claim 11 wherein the thickness of the thermoplastic polyimide layer is 100% or more and less than 200% of an average roughness at 10 points on the surface of the metal foil which contacts the thermoplastic polyimide layer.

19. The method for manufacturing the metal foil laminate according to claim 11 wherein the thickness of the thermoplastic polyimide layer is 100% or more and less than 150% of an average roughness at 10 points on the surface of the metal foil which contacts the thermoplastic polyimide layer.

20. The method for manufacturing the metal foil laminate according to claim 11 wherein the thickness of the thermoplastic polyimide layer is 100% or more and less than 120% of an average roughness at 10 points on the surface of the metal foil which contacts the thermoplastic polyimide layer.

21. A method for manufacturing a metal foil laminate having a polyimide layer between two metal foil layers; said method comprising the steps of heating and pressing one metal foil and a polyimide/metal foil laminate including the other metal foil and a polyimide layer comprising a thermoplastic polyimide layer outermost to the other metal foil so that the thermoplastic polyimide layer is put on the former metal foil, the thickness of the thermoplastic polyimide layer being 100% or more and less than 300% of an average roughness at 10 points on the surface of the metal foil which contacts the thermoplastic polyimide layer, wherein said average roughness of said metal foil is 0.47 to 1.85 μm.

22. The method for manufacturing the metal foil laminate according to claim 21 wherein the thickness of the metal foil is in the range of 5 to 175 μm.

23. The method for manufacturing the metal foil laminate according to claim 21 wherein the glass transition temperature of the thermoplastic polyimide is in the range of 150 to 350° C.

24. The method for manufacturing the metal foil laminate according to claim 21 wherein the thickness of the polyimide layer between the two metal foil layers is in the range of 5 to 150 μm.

25. The method for manufacturing the metal foil laminate according to claim 21 wherein heating and pressing conditions are the glass transition temperature or more of the thermoplastic polyimide and in the range of 20 to 150 kg/cm$^2$.

26. The method for manufacturing the metal foil laminate according to claim 21 wherein the metal foil is selected from copper, iron, nickel, chromium, molybdenum, aluminum, or alloys mainly including these metals.

27. The method for manufacturing the metal foil laminate according to claim 26 wherein the metal foil is copper.

28. The method for manufacturing the metal foil laminate according to claim 21 wherein the thickness of the thermoplastic polyimide layer is 100% or more and less than 200% of an average roughness at 10 points on the surface of the metal foil which contacts the thermoplastic polyimide layer.

29. The method for manufacturing the metal foil laminate according to claim 21 wherein the thickness of the thermoplastic polyimide layer is 100% or more and less than 150% of an average roughness at 10 points on the surface of the metal foil which contacts the thermoplastic polyimide layer.

30. The method for manufacturing the metal foil laminate according to claim 21 wherein the thickness of the thermoplastic polyimide layer is 100% or more and less than 120% of an average roughness at 10 points on the surface of the metal foil which contacts the thermoplastic polyimide layer.

* * * * *